(12) United States Patent
Kawada et al.

(10) Patent No.: US 8,114,783 B2
(45) Date of Patent: Feb. 14, 2012

(54) SILICON CARBIDE SEMICONDUCTOR ELEMENT, METHOD OF MANUFACTURING THE SAME, AND SILICON CARBIDE DEVICE

(75) Inventors: Yasuyuki Kawada, Matsumoto (JP); Takeshi Tawara, Matsumoto (JP); Shun-ichi Nakamura, Matsumoto (JP); Masahide Gotoh, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 821 days.

(21) Appl. No.: 12/193,291

(22) Filed: Aug. 18, 2008

(65) Prior Publication Data

US 2009/0045414 A1 Feb. 19, 2009

(30) Foreign Application Priority Data

Aug. 17, 2007 (JP) .................. 2007-212919

(51) Int. Cl.
*H01L 31/0312* (2006.01)
(52) U.S. Cl. .......... 438/761; 257/77; 257/597; 257/607; 257/653; 257/660; 257/688; 257/E29.104; 257/E21.476
(58) Field of Classification Search .................. 438/761; 257/77, 597, 607, 653, 660, 688, E29.104, 257/E21.476
See application file for complete search history.

(56) References Cited

U.S. PATENT DOCUMENTS 6,794,684 B2 * 9/2004 Slater et al. .................. 257/77

FOREIGN PATENT DOCUMENTS

| JP | 8-8210 A | 1/1996 |
|----|----------|--------|
| JP | 8-64801 A | 3/1996 |
| JP | 2000-208438 A | 7/2000 |
| JP | 2002-175997 A | 6/2002 |
| JP | 2006-202883 A | 8/2006 |

* cited by examiner

*Primary Examiner* — Thao Le
*Assistant Examiner* — Tanika Warrior
(74) *Attorney, Agent, or Firm* — Rossi, Kimms & McDowell LLP

(57) ABSTRACT

A silicon carbide semiconductor element and a manufacturing method thereof are disclosed in which a low contact resistance is attained between an electrode film and a wiring conductor element, and the wiring conductor element is hardly detached from the electrode film. In the method, a nickel film and a nickel oxide film are laminated in this order on a surface of an n-type silicon carbide substrate or an n-type silicon carbide region of a silicon carbide substrate, followed by a heat treatment under a non-oxidizing condition. The heat treatment transforms a portion of the nickel film into a nickel silicide film. Then, the nickel oxide film is removed with hydrochloric acid solution, and subsequently, a nickel aluminum film and an aluminum film are laminated in this order on a surface of the nickel silicide film.

8 Claims, 10 Drawing Sheets

FIG. 4

| Experiment | Electrode structure | Film thickness | Heat treatment |
|---|---|---|---|
| 1 | NiO/SiC | NiO: 0.2 μm | In vacuum (≤5 x 10$^{-4}$ Pa) 1,000°C, 5 min |
| 2 | NiO/Ni/SiC | NiO: 0.1 μm Ni: 0.1 μm | In vacuum (≤5 x 10$^{-4}$ Pa) 1,000°C, 5 min |

FIG. 9

| Experiment | electrode structure | film thickness | heat treatment | HCl soln treatment | NiAl film | adhesivity | remark |
|---|---|---|---|---|---|---|---|
| 3 | Ni | Ni: 0.1μm | 1,000°C 5 min | none | none | wholly peeled off | prior art |
| 4 | NiO/Ni | NiO: 0.1μm Ni: 0.1μm | 1,000°C 5 min | none | none | almost peeled off | |
| 5 | NiO/Ni | NiO: 0.1μm Ni: 0.1μm | 1,000°C 5 min | done | none | little peeled off | |
| 6 | NiO/Ni | NiO: 0.1μm Ni: 0.1μm | 1,000°C 5 min | done | deposited | no peeling off | |

SILICON CARBIDE SEMICONDUCTOR ELEMENT, METHOD OF MANUFACTURING THE SAME, AND SILICON CARBIDE DEVICE

BACKGROUND OF THE INVENTION

A. Field of the Invention

The present invention relates to a silicon carbide semiconductor element, a method of manufacturing the same, and a silicon carbide device.

B. Description of the Related Art

Silicon carbide (hereinafter also referred to as SiC) is thermally, chemically and mechanically stable, and is expected to be applied to a wide range of industry fields including light emitting elements, high frequency devices, and power semiconductor devices. High withstand voltage MOSFETs using SiC, for example, have an advantage of lower on-resistance than high withstand voltage MOSFETs using silicon (Si). Schottky diodes using SiC have an advantage of lower forward voltage drop than Schottky diodes using silicon.

Intrinsically, on-resistance and switching speed of power devices are in a trade-off relation. Nevertheless power devices using SiC can achieve low on-resistance and high switching speed at the same time. In order to achieve low on-resistance or high switching speed, it is necessary to reduce contact resistance at an ohmic contact.

Recently, there is a technique widely employed for forming a low resistance ohmic contact in an n-type SiC region, in which an ohmic electrode structure is formed by depositing an electrode film, and the ohmic electrode structure is then heat treated at a high temperature in the range of 800° C. to 1,200° C. (See for example, Japanese Patent No. 3303530, and Japanese Unexamined Patent Application Publication Nos. 2002-175997 and H08-064801. The electrode film is, for example, a film of nickel, tungsten or titanium. Nickel, in particular, used for an electrode film, has attained a practical contact resistance value in an order of $10^{-6} \Omega \cdot cm^2$ at an ohmic contact. So, an ohmic contact using nickel is very promising ohmic contact.

FIG. 11 shows a result of elemental analysis along the depth direction of a conventional ohmic contact using nickel obtained by means of X-ray photoelectron spectroscopy. In FIG. 11, the ordinate represents the content of the elements and the abscissa represents the sputtering time (arbitrary unit). In order to form an ohmic contact shown in FIG. 11, a typical nickel film first is deposited on a SiC substrate by a sputtering method. Then, a heat treatment is conducted in a vacuum (not higher than $5 \times 10^{-4}$ Pa) at 1,000° C. for 5 minutes. The heat treatment at the high temperature forms a conductive thermal reaction layer (a nicked silicide film) of a Ni—Si—C mixture on the nickel film surface. In the surface region of the nickel silicide film, a large amount of carbon precipitates that are diffused from the SiC substrate and the surface is virtually covered with the carbon.

When a wiring conductor element such as aluminum film is connected to an electrode film of a nickel film with precipitates of carbon thereon, a problem of increase in contact resistance arises between the electrode film and the wiring conductor element. There is an additional problem that the wiring conductor element is liable to detach.

A method to prevent carbon from precipitating has been proposed (Japanese Patent No. 3646548, for example) in which an ohmic electrode is formed of an alloy composed of nickel and another metal that easily forms a carbide, and a nickel film is formed on the film of this alloy. Another method has been proposed (Japanese Unexamined Patent Application Publication No. 2006-202883, for example) in which an ohmic electrode is composed of a nickel silicide film, a first nickel film, a titanium film, a film of alternately formed nickel and silicon, and a second nickel film laminated in this order.

However, Japanese Patent No. 3646548 and Japanese Unexamined Patent Application Publication No. 2006-202883 fail to mention a technology to connect a wiring conductor element such as an aluminum film to the electrode film of such as nickel. Consequently, it is a problem with these methods of these two documents that a wiring contact element may fail to be connected to a nickel film on which a silicon oxide film is formed. The technology disclosed in Japanese Unexamined Patent Application Publication No. 2006-202883 has an additional problem of complicated manufacturing process and high cost due to a multiple of laminated layers.

The present invention is directed to overcoming or at least reducing the effects of one or more of the problems set forth above.

SUMMARY OF THE INVENTION

It is therefore an object of the present invention to solve the problems in the conventional technologies as described above and provide a silicon carbide semiconductor element having a low contact resistance between an electrode film and a wiring conductor element. Another object of the invention is to provide a method of manufacturing such a silicon carbide semiconductor element. Still another object of the invention is to provide a silicon carbide semiconductor element and a manufacturing method thereof in which a wiring conductor element is hardly detached from an electrode film.

To solve the above-described problems and accomplish the objects, a method of manufacturing a silicon carbide semiconductor element of the invention comprises a first step for forming a nickel film on a surface of an n-type silicon carbide substrate or an n-type silicon carbide region formed in a surface region of a silicon carbide substrate, a next step of forming a nickel oxide film on a surface of the nickel film, and a subsequent step of heat treatment step in a non-oxidizing atmosphere. In a preferred embodiment, the non-oxidizing atmosphere in the heat treatment is an atmosphere of vacuum or argon. A nickel silicide film is formed in a portion of the nickel film in the heat treatment step.

After the heat treatment step, there is a nickel oxide film-removing step for removing the nickel oxide film with a hydrochloric acid solution and an aluminum film-forming step for forming an aluminum film on a surface of the nickel silicide film from which the nickel oxide film has been removed.

The method further may comprise, after the nickel oxide film-removing step, a nickel aluminum film-forming step for forming a nickel aluminum film on a surface of the nickel silicide film, and then, the aluminum film is formed on the surface of the nickel aluminum film.

The nickel film preferably has a thickness in a range of 0.05 μm to 0.2 μm, and the nickel oxide film has a thickness in a range of 0.05 μm to 0.15 μm. The nickel aluminum film preferably has a thickness in a range of 5 nm to 20 nm, and the aluminum film has a thickness in a range of 2 μm to 4 μm.

In a preferred embodiment, the nickel aluminum film is formed by means of a sputtering method using a nickel aluminum target containing nickel in a range of 40 at % to 60 at % and the remainder of aluminum.

A silicon carbide semiconductor element according to the invention comprises an n-type silicon carbide substrate or a silicon carbide substrate having an n-type silicon carbide region in a surface region thereof, a nickel film formed on a surface of the n-type silicon carbide substrate or a surface of the n-type silicon carbide region of a silicon carbide substrate, a nickel aluminum film formed on the nickel film, and an aluminum film formed on a surface of the nickel aluminum film. The nickel film is an ohmic electrode.

According to the invention described above, the heat treatment after forming the nickel oxide film prevents carbon from precipitating on the surface of the nickel silicide film.

According to the method of claims 4 or 6 of the invention, a nickel silicide film without precipitation of carbon thereon is formed, and an aluminum film is formed on the surface of the nickel silicide film. Therefore, an ohmic electrode is formed in which a contact resistance between an electrode film and a wiring conductor element is low and the wiring conductor element is hardly detached from the electrode film.

According to the invention, an adhesion layer of a nickel aluminum film is formed on a surface of a nickel silicide film without carbon precipitation, and an aluminum film is formed on the adhesion layer of a nickel aluminum film. Therefore, an ohmic electrode is formed in which the wiring conductor is more hardly detached from the electrode film.

A silicon carbide semiconductor element and a manufacturing method thereof according to the invention have the advantage that a low contact resistance is attained between an electrode film and a wiring conductor element. The element and method also have the advantage that the wiring conductor element is hardly detached from the electrode film.

Some preferred embodiment of a silicon carbide semiconductor element and manufacturing method thereof according to the invention will be described in the following with reference to the accompanying drawings.

BRIEF DESCRIPTION OF THE DRAWINGS

The foregoing advantages and features of the invention will become apparent upon reference to the following detailed description and the accompanying drawings, of which:

FIG. 4 is a chart describing on test samples of silicon carbide semiconductor element having a nickel oxide film;

FIG. 9 shows a relationship between a method of forming an aluminum film on a nickel silicide film and adhesion performance of the aluminum film;

DETAILED DESCRIPTION OF SPECIFIC EMBODIMENTS

Embodiment

Figure 1:
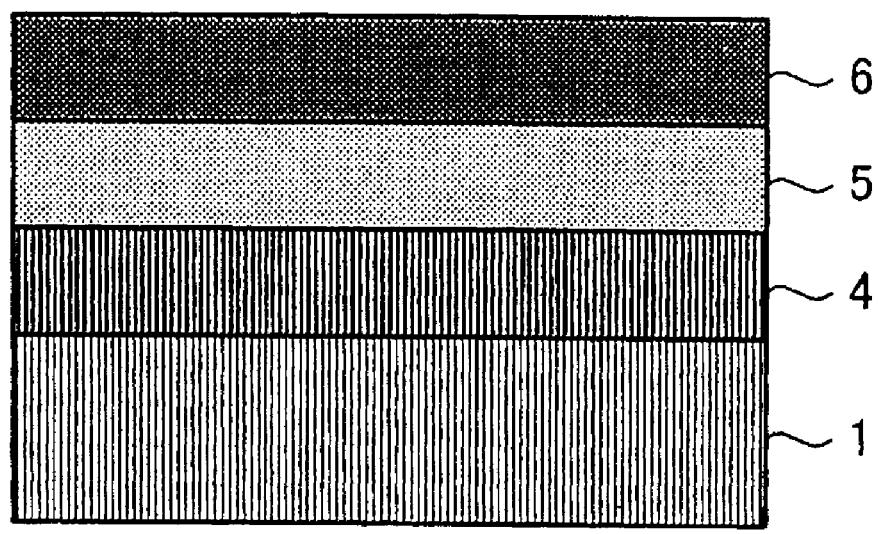
FIG. 1 is a sectional view showing a structure of a silicon carbide semiconductor element according to an embodiment of the invention.

FIG. 1 is a sectional view showing a structure of a silicon carbide semiconductor element according to an embodiment of the invention. Referring to FIG. 1, an silicon carbide semiconductor element of the embodiment comprises n-type SiC region 1, and a lamination structure of nickel silicide ($Ni_2Si$) film 4, nickel aluminum (NiAl) film 5, and aluminum (Al) film 6 laminated on SiC region 1 in this order.

Figure 2:
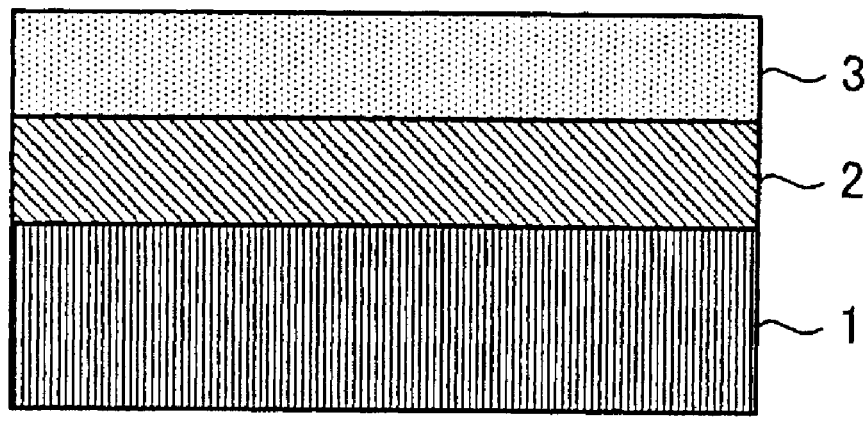
FIG. 2 is a sectional view showing a manufacturing process of a silicon carbide semiconductor element according to an embodiment of the invention.
Figure 3:
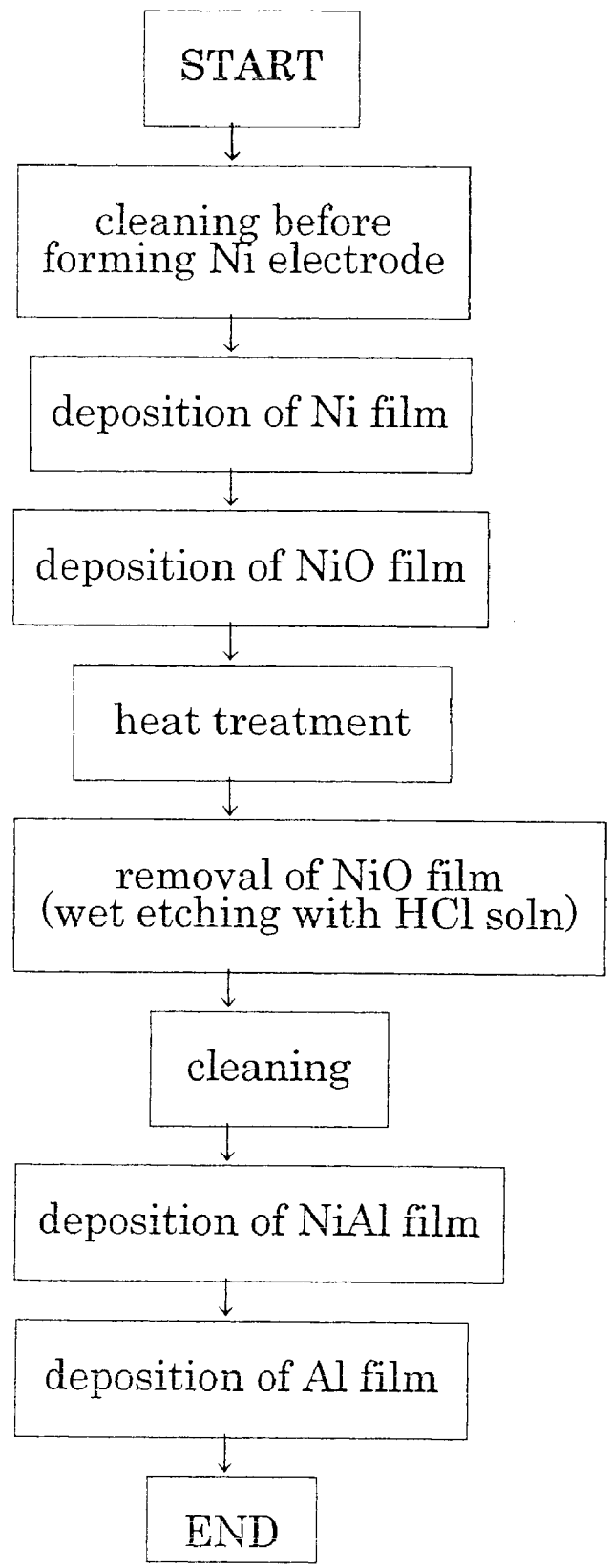
FIG. 3 is a flow chart showing a manufacturing process of a silicon carbide semiconductor element according to an embodiment of the invention.

Next, a method of manufacturing a silicon carbide semiconductor element according to an embodiment of the invention will be described. FIG. 2 is a sectional view showing a manufacturing process of the silicon carbide semiconductor element of the embodiment of the invention. FIG. 3 is a flow chart showing a manufacturing process of the silicon carbide semiconductor element of the embodiment of the invention. Referring to FIG. 3, a cleaning step is first conducted (step S301) prior to forming a nickel electrode. Step S301 cleans a surface of n-type SiC substrate 1 or n-type SiC region 1 of the element.

Then, nickel film 2 is deposited (step S302) on a surface of n-type SiC substrate 1 or n-type SiC region 1 cleaned in step S301. Subsequently, nickel oxide (NiO) film 3 is deposited (step S303) on nickel film 2 deposited in step S302. Deposition steps of S302 and S303 are carried out by means of a DC sputtering method, for example. The sputtering process in this embodiment is carried out under the conditions of DC power of 300 W, pressure of 0.4 Pa, and a substrate temperature without heating. The sputtering in step S302 is conducted using solely argon gas. The sputtering in step S303 is conducted using, for example, a sputtering gas of a mixed gas containing 20% of oxygen in argon gas and a target of nickel.

If the thickness of the nickel oxide is too thin, diffusion of carbon to the outermost surface of the substrate cannot be suppressed. If the nickel oxide film is too thick, removal of nickel oxide film 3 afterwards by an etching step described later takes a long time. Accordingly, a thickness of nickel oxide 3 is preferably in a range of 0.05 μm to 0.15 μm. If the thickness of nickel film 2 is too thin, the sputtering process is hardly controlled. In addition, an ohmic contact may not be established. Accordingly, a thickness of the nickel film 2 is preferably in a range of 0.05 μm to 0.15 μm.

Next, a heat treatment step (step S304) is conducted. Through the heat treatment, a portion of nickel film 2 is transformed into silicide film 4. The heat treatment in step S304 is carried out at a high temperature in a vacuum state. Specifically, the heat treatment is conducted at 1,000° C. for 2 minutes in a state evacuated down to a pressure of not higher than $5 \times 10^{-4}$ Pa. Then, the treated article is cooled down to the room temperature. Although the heat treatment in step S304 is conducted in vacuum, the step is not limited to conduct in vacuum, but other conditions that do not cause oxidation is possible, for example, an argon atmosphere can be employed. However, a nitrogen atmosphere is not appropriate. After this step, a structure as shown in FIG. 2 results having nickel film 2 (with nickel silicide film 4 thereon) and nickel oxide film 3 laminated on n-type SiC region 1 in this order.

After that, nickel oxide film 3 is removed (step S305) by a wet etching process using a hydrochloric acid solution. By this step, nickel silicide film 4 that is formed on nickel film 2 by the heat treatment of step S304 becomes the outermost surface. In step S305, an etching process is conducted, for example, for 6 minutes using a hydrochloric acid solution heated to 50° C. Then, processes of cleaning with pure water (step S306) and drying are conducted. In step S305, a concentration of the hydrochloric acid is adequate if it can dissolve nickel oxide film 3. However, if the concentration of hydrochloric acid is too low, it takes a long time to remove nickel film 3, and moreover, nickel oxide film 3 may not dissolve. Accordingly, the hydrochloric acid solution preferably contains hydrogen chloride in the range of 10 to 37 wt %.

Then, nickel aluminum film 5 is deposited on nickel silicide film 4 (step S307), followed by deposition of aluminum film 6 (step S308). The deposition processes in steps S307 and S308 are carried out by means of a DC sputtering method, for example. The conditions in this embodiment are a DC power of 300 W, a pressure of 0.4 Pa, and a substrate temperature of 150° C. The sputtering processes are conducted continuously in vacuum using solely argon gas. The composition of the nickel aluminum target in step S307 is nickel in the range of 40 to 60 at % and the remainder of aluminum.

If the thickness of nickel aluminum film 5 is too thin, the function as an adhesion layer cannot be performed. If a thickness of nickel aluminum film 5 is too thick, a resistance higher than that of aluminum film 6 results. Accordingly, a thickness of nickel aluminum film 5 is preferably in the range of 5 nm to 20 nm. If a thickness of aluminum film 6 is too thin, a resistance of nickel aluminum film 5 becomes higher than that of aluminum film 6. Although the higher the thickness of aluminum film 6 is the better, with an aluminum film that is too thick it takes a long time to form the film. For example, it takes about 1 hour to form an aluminum film with a thickness of 4 µm. Accordingly, a thickness of aluminum film 6 is preferably in the range of 2 µm to 4 µm.

Studies have been made to suppress precipitation of carbon from n-type SiC region 1. FIG. 4 shows test samples of silicon carbide semiconductor elements having a nickel oxide film formed therein. The sample of Experiment 1 as shown in FIG. 4 has a structure comprised of n-type SiC region 1 and nickel oxide film 3 deposited on n-type SiC region 1. The thickness of nickel oxide film 3 is about 0.2 µm. The sample of Experiment 2 has a structure comprised of n-type SiC region 1, nickel film 2 deposited on n-type SiC region 1, and nickel oxide film 3 deposited on nickel film 2. Therefore, the sample of Experiment 2 has the same structure as the silicon carbide semiconductor element according the embodiment of the invention as described hereinbefore. Both the thicknesses of nickel film 2 and nickel oxide film 3 are about 0.1 µm. The samples of Experiment 1 and Experiment 2 are heat treated at 1,000° C. for 5 minutes in a vacuum state (at a pressure not higher than $5 \times 10^{-4}$ Pa).

Figure 5:
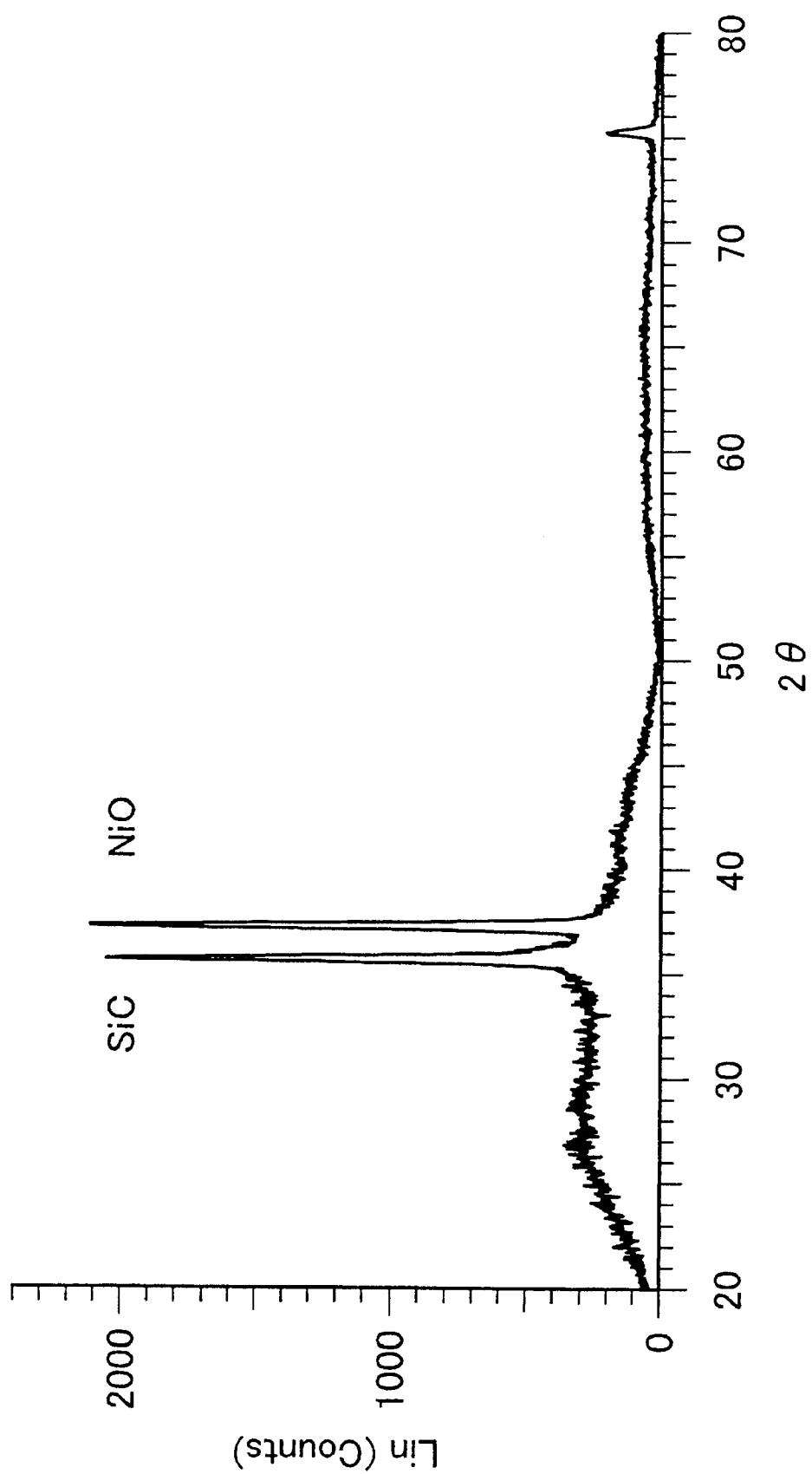
FIG. 5 shows a result of a test for determining the products in the sample of Experiment 1 obtained by means of an X-ray diffraction method.
Figure 6:
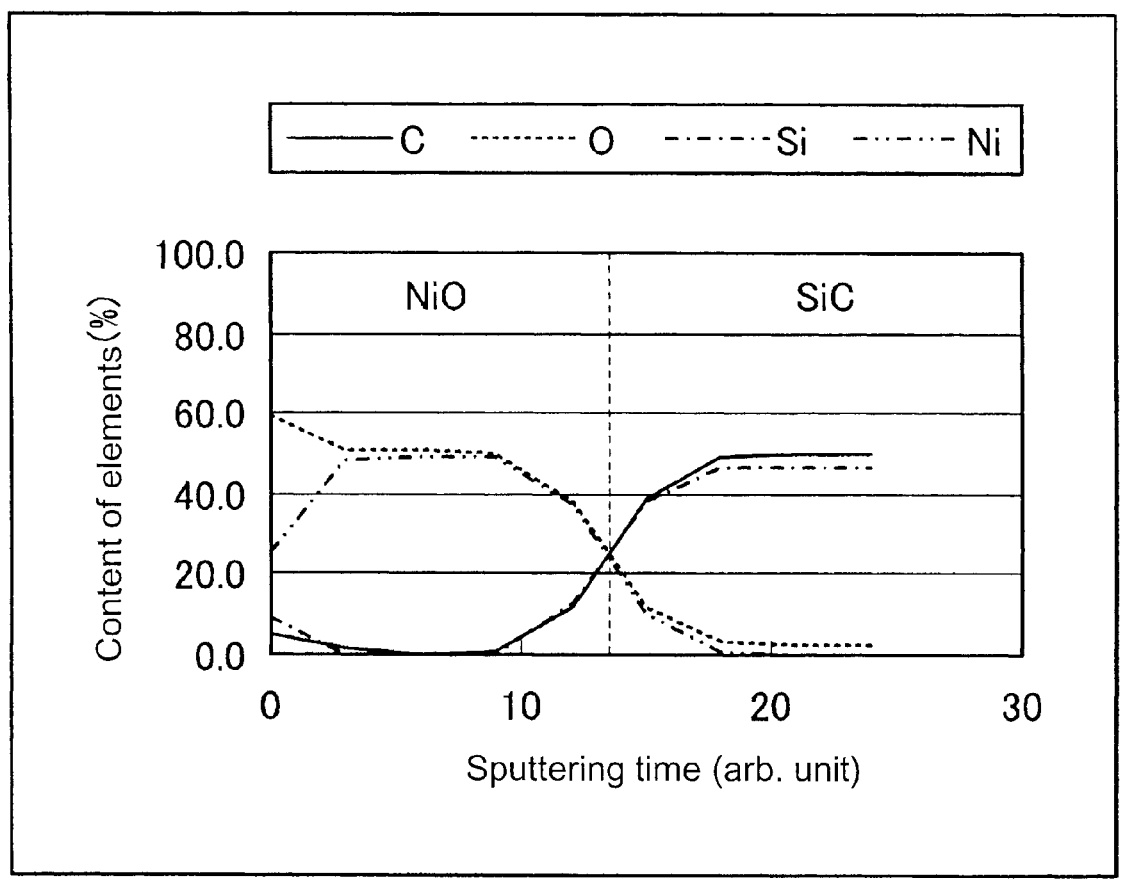
FIG. 6 shows a test result of elemental analysis along the depth direction on the sample of Experiment 1 by means of an X-ray photoelectron spectroscopy method.

Studies are first done on the sample of Experiment 1. FIG. 5 shows a result of a test for identifying the product in the sample of Experiment 1 obtained by means of an X-ray diffraction method (XRD). In FIG. 5, the ordinate represents intensity and the abscissa represents the angle (2θ) of the diffraction line. In the sample of Experiment 1 as shown in FIG. 5, only a peak of nickel oxide is observed except for the peak of SiC. FIG. 6 shows a result of elemental analysis along the depth direction on the sample of Experiment 1 obtained by means of an X-ray photoelectron spectroscopy (XPS). In FIG. 6, the ordinate represents the content of the elements and the abscissa represents the sputtering time (in arbitrary unit). In the sample of Experiment 1 as shown in FIG. 6, no reaction between n-type SiC region 1 and nickel oxide film 3 is observed.

Figure 7:
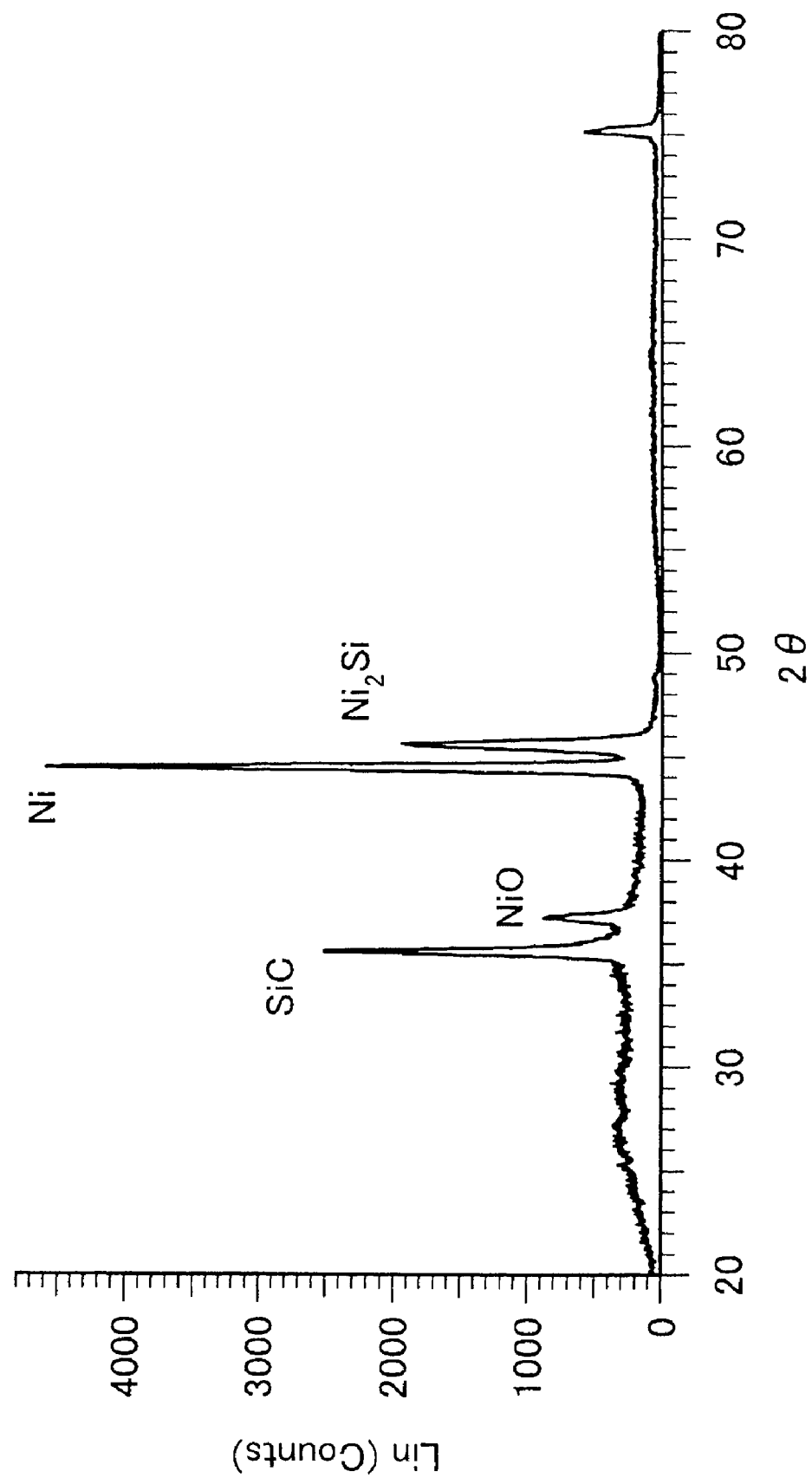
FIG. 7 shows a result of a test for determining the products in the sample of Experiment 2 obtained by means of an X-ray diffraction method.
Figure 8:
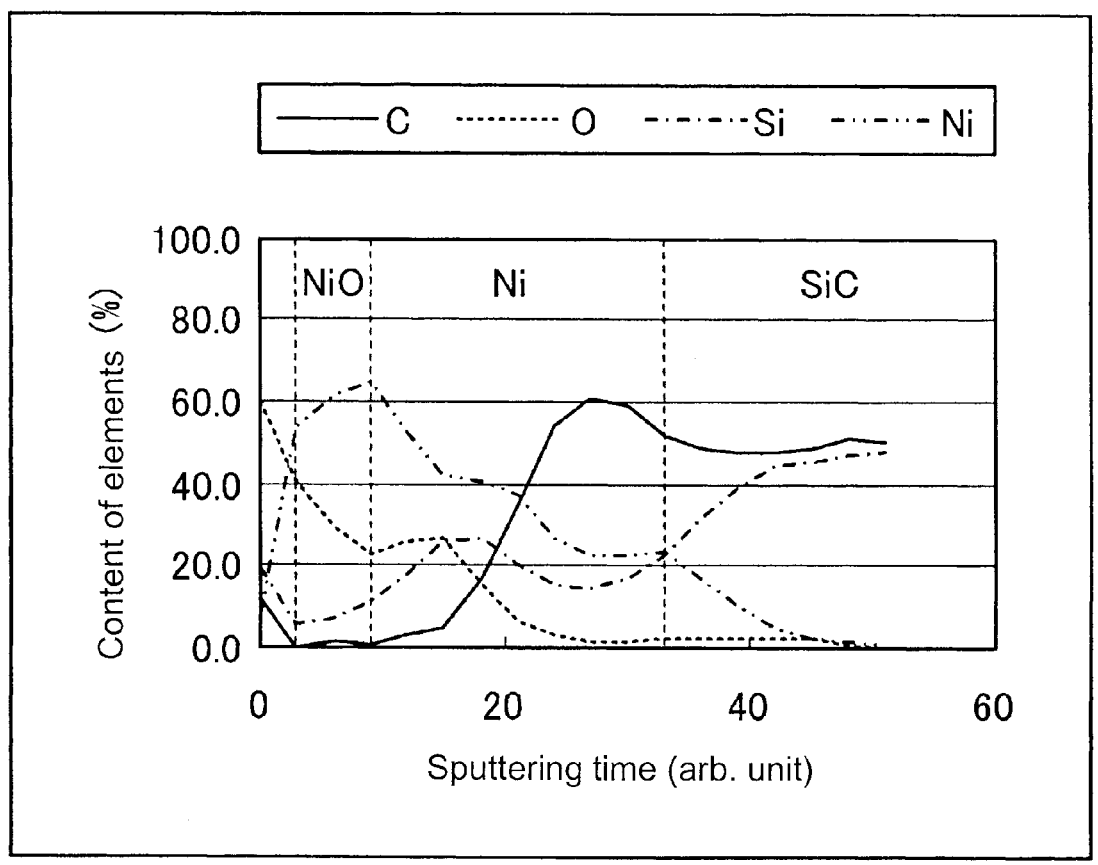
FIG. 8 shows the test results of elemental analysis along the depth direction on the sample of Experiment 2 obtained by means of an X-ray photoelectron spectroscopy method.

Then, studies on the sample of Experiment 2 are done. FIG. 7 shows the result of a test for identifying the product in the sample of Experiment 2 obtained by means of an X-ray diffraction method. In FIG. 7, the ordinate represents intensity and the abscissa represents the angle (2θ) of the diffraction line. In the sample of Experiment 2 as shown in FIG. 7, peaks of nickel oxide, nickel, and nickel silicide are observed in addition to the peak of SiC. FIG. 8 shows a result of elemental analysis along the depth direction on the sample of Experiment 2 obtained by means of an X-ray photoelectron spectroscopy. In FIG. 8, the ordinate represents the content of the elements and the abscissa represents the sputtering time (in arbitrary unit). In the sample of Experiment 2 as shown in FIG. 8, silicon and carbon diffuse from n-type SiC region 1 into nickel film 2. As a result, a portion of nickel film 2 transforms into nickel silicide film 4. Carbon does not diffuse into nickel oxide film 3, but the silicon diffuses to the surface. From a binding energy shift of the XPS, it has been indicated that the surface of nickel oxide film 3 has become a $SiO_2$ film due to the diffused silicon.

In the samples of Experiment 1 and Experiment 2 as shown above, carbon does not diffuse to the outermost surface. When a nickel electrode is formed on n-type SiC region 1, a heat treatment process (an annealing process) that is conducted after forming nickel oxide film 3 on nickel film 2 forms nickel silicide film 4 without diffusion of carbon up to the surface. Nickel silicide film 4 exhibits lower resistivity than nickel film 2. Therefore, the sample of Experiment 2 is suited for a silicon carbide semiconductor element of the present invention.

The $SiO_2$ film formed on the surface of nickel oxide film 3 is an insulator. Nickel oxide film 3 is a semiconductor with very high resistivity. Consequently, the $SiO_2$ film and nickel oxide film 3 have to be removed before forming aluminum film 6. Actual devices include $SiO_2$ films with their own function in addition to the one accompanying the ohmic electrode, so the $SiO_2$ film cannot be removed using fluorine. Consequently, using a hydrochloric acid solution, nickel oxide film 3 is removed and at the same time, the $SiO_2$ film laminated on nickel oxide film 3 is removed with it. In this embodiment, the sample of Experiment 2 is dipped for etching for 6 minutes in a hydrochloric acid solution containing 37% of hydrogen chloride heated to 50° C. This process peels off nickel oxide film 3 having a $SiO_2$ film laminated thereon, exposing nickel silicide film 4 on the uppermost surface.

Next, studies have been made of a method for forming a wiring material of aluminum film 6 on nickel silicide film 4 exposed on the uppermost surface through the above-described process. FIG. 9 shows a relationship between a method for forming aluminum film 6 on nickel silicide film 4 and the adhesion performance of aluminum film 6. The adhesion performance in FIG. 9 is determined by sticking a tape and then peeling the tape off. Aluminum film 6 and nickel aluminum film 5 are deposited by a DC sputtering method under the conditions of a DC power of 300 W, a pressure of 0.4 Pa, a sputtering gas of argon, and a substrate temperature of 150° C. The composition of the nickel aluminum target for sputtering of the nickel aluminum film 5 is 50% of nickel and 50% of aluminum. The thickness of the nickel aluminum film 5 is 10 nm and the thickness of aluminum film 6 is 3 µm.

The composition of nickel aluminum film 5 is determined to hold a balance between the two elements in order to enhance adhesiveness between nickel silicide film 4 and aluminum film 6, and to prevent the resistance of nickel aluminum film 5 from rising. Concerning the thickness of nickel aluminum film 5, a too thin film cannot ensure adhesiveness.

However, a thin film is favorable for reducing electric resistance. Accordingly, a thickness of nickel aluminum film 5 is preferably around 10 nm.

Experiment 3 in FIG. 9 shows a method of forming aluminum film 6 on a substrate without nickel oxide film 3 according to a prior art, and adhesion performance of aluminum film 6 formed by that method. In the sample of Experiment 3, aluminum film 6 is directly formed on a surface with a plenty of carbon precipitates, and aluminum film 6 is deposited after nickel film 2 is deposited. In this sample, aluminum film 6 is wholly peeled off after only one time of peeling test using a tape. This result is caused by weak adhesiveness between the carbon precipitates on the sample surface and the aluminum. To improve adhesiveness, a method for holding the adhesiveness has been proposed in which the substrate is heated to a high temperature. But, aluminum film 6 detaches in many specimen elements, resulting in a degraded yield.

In the sample of Experiment 4, nickel oxide film 3 is deposited on nickel film 2, and then aluminum film 6 is deposited on the nickel oxide film. In this sample, only one peeling test using a tape peels off almost the whole of aluminum film 6. This is caused by weak adhesiveness between nickel oxide film 3 and aluminum film 6, although the precipitation of carbon on the sample surface is suppressed.

In the sample of Experiment 5, nickel oxide film 3 is deposited on nickel film 2 and, after removing nickel oxide film 3 with a hydrochloric acid solution, aluminum film 6 is deposited. In this sample, only a part of aluminum film 6 peels off after several times of peeling test using a tape. Thus, the adhesiveness of aluminum film 6 has been improved. This is because the carbon precipitation is suppressed and the nickel oxide film is removed, thus, aluminum film 6 is deposited on nickel silicide film 4.

In the sample of Experiment 6, nickel oxide film 3 is deposited on nickel film 2 and, after removing nickel oxide film 3 with a hydrochloric acid solution, and after depositing an adhesion layer of nickel aluminum film 5 with a thickness of 10 nm, aluminum film 6 is deposited on the adhesion layer. Therefore, aluminum film 6 is deposited on nickel aluminum film 5 which is deposited on nickel silicide film 4. In this sample, the peeling test using a tape in several tens of times does not cause peeling off of aluminum film 6. This is brought about by excellent adhesiveness of nickel aluminum film 5 with both nickel silicide film 4 and aluminum film 6.

In order to form a contact electrode on n-type SiC region 1 using nickel, and to form a wiring material of aluminum film 6 on the contact electrode in this embodiment of the invention, nickel oxide film 3 is first formed on nickel film 2. Then, heat treatment is conducted to modify nickel film 2 to a mixed film of nickel silicide and carbon (nickel silicide film 4). After removing nickel oxide film 3 using a hydrochloric acid solution, nickel aluminum film 5 and aluminum film 6 are sequentially laminated in this order. By this procedure, a reliable ohmic contact is formed that exhibits strong adhesiveness and has aluminum film 6 that scarcely peels off. Thus, the samples of Experiment 5 and Experiment 6 are suited for a silicon carbide semiconductor element of this embodiment. Of the samples, the sample of Experiment 6 is more appropriate for a silicon carbide semiconductor element according to embodiment of the invention.

Figure 10:
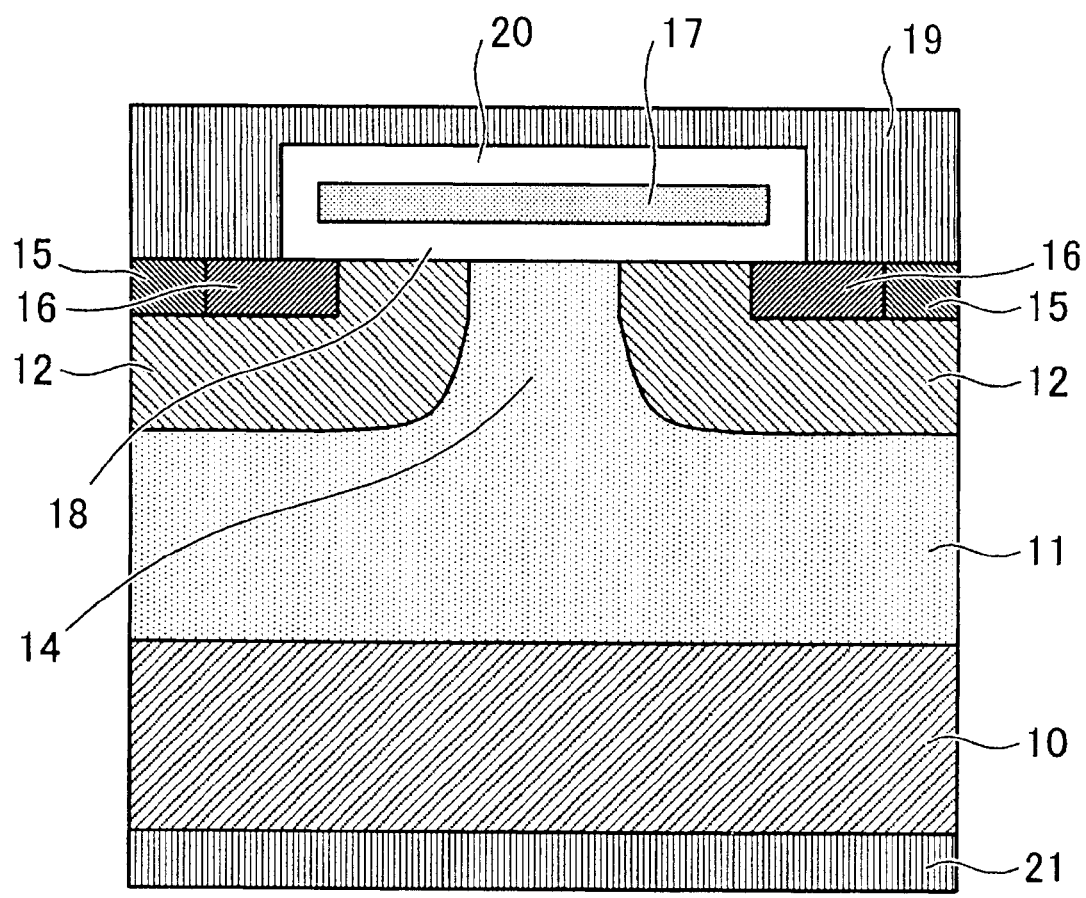
FIG. 10 is a sectional view showing a structure of a MOS-FET using a silicon carbide semiconductor element according to an embodiment of the invention.
Figure 11:
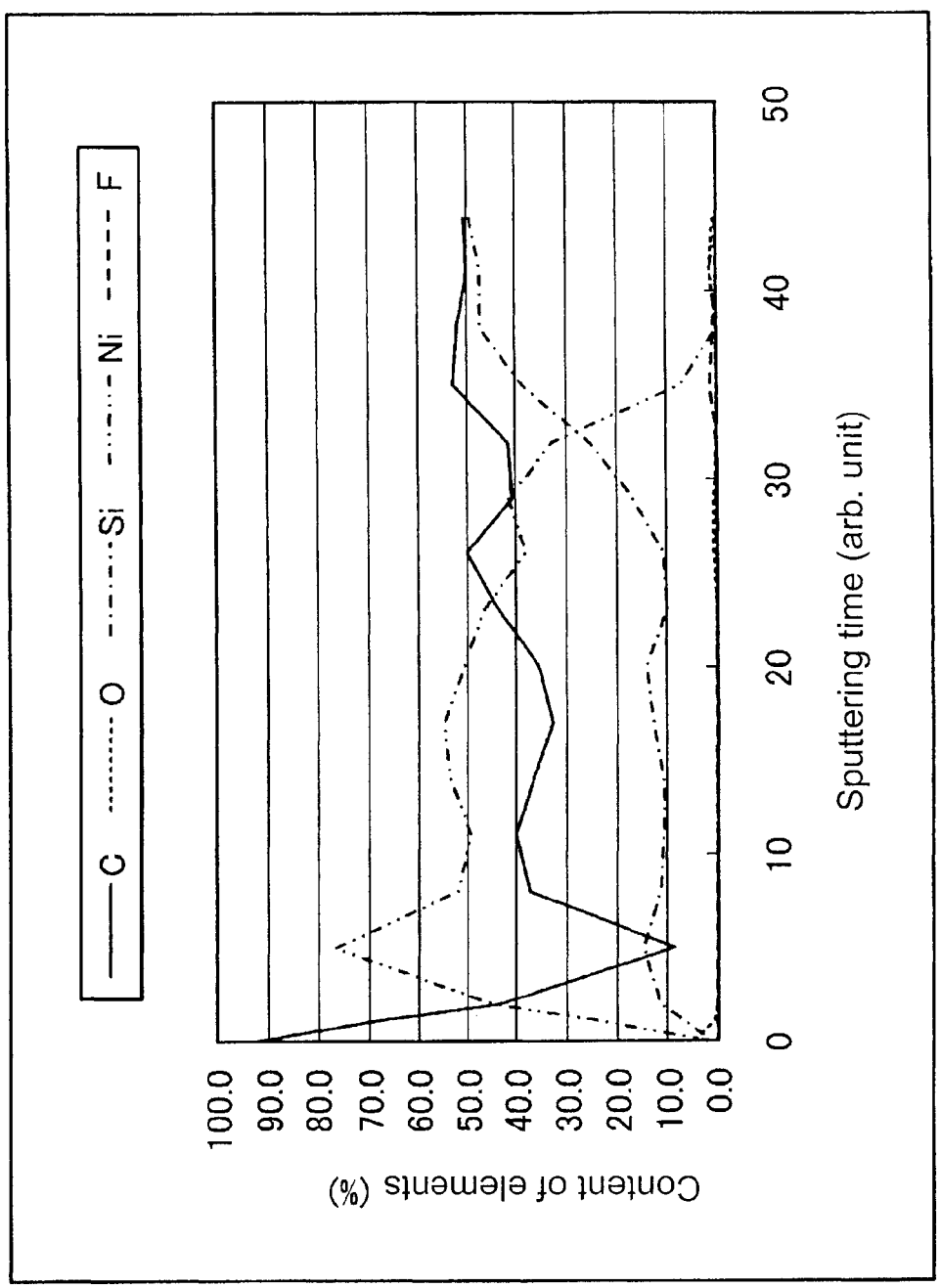
FIG. 11 shows the test results of elemental analysis along the depth direction on a sample of ohmic contact using nickel according to a prior art technology.

Now, description will be made of a device employing the silicon carbide semiconductor element according to embodiment of the invention. FIG. 10 is a sectional view of a structure of a MOSFET using a silicon carbide semiconductor element according an embodiment of the invention. Referring to FIG. 10, the MOSFET comprises substrate 10 and drift layer 11 formed on substrate 10. On a part of drift layer 11, two body regions 12 are separately provided. The region between the two body regions 12 on the drift layer is JFET region 14 (a junction field effect transistor region). Body contact region 15 is formed in a portion of the surface region of each body region 12. Source contact region 16 is formed in a portion of the surface region of body region 12 in a place nearer to JFET region 14 than body contact region 15, source contact region 16 being in contact with body contact region 15 and not in contact with JFET region 14. Thus, two MOSFETs are provided at both sides of JFET region 14.

Gate electrode 17 is disposed over JFET region 14 and a portion of body region 12 through intercalating gate insulation film 18. Source electrode 19 is formed in contact with body contact region 15 and source contact region 16. Source electrode 19 is isolated from gate electrode 17 with interlayer insulation film 20. Drain electrode 21 is provided in contact with the back surface of substrate 10.

In the MOSFET shown in FIG. 10, substrate 10 is an n-type SiC region and drain electrode 21 is a nickel film. Thus, a silicon carbide semiconductor element of the invention can be applied to the drain side of the MOSFET. Therefore, a silicon carbide semiconductor element according to an embodiment of the invention can be used in a silicon carbide device.

As is described thus far, a silicon carbide semiconductor element and a manufacturing method thereof are useful in a semiconductor device using a silicon carbide substrate, and suited in particular for forming an ohmic electrode.

Thus, a silicon carbide semiconductor element and a manufacturing method thereof have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2007-212919, filed on 17 Aug. 2007. The disclosure of the priority application in its entirety, including the drawings, claims, and the specification thereof, is incorporated herein by reference.

DESCRIPTION OF SYMBOLS

1: n-type silicon carbide substrate or an n-type silicon carbide region of a silicon carbide substrate
2: nickel film
3: nickel oxide film
4: nickel silicide film
5: nickel aluminum film
6: aluminum film

What is claimed is:
1. A method of manufacturing a silicon carbide semiconductor element comprising:
   forming a nickel film on a surface of an n-type silicon carbide substrate or an n-type silicon carbide region formed on a silicon carbide substrate;
   forming a nickel oxide film on a surface of the nickel film; and
   heat treating the nickel film in a non-oxidizing atmosphere.
2. The method of manufacturing a silicon carbide semiconductor element according to claim 1, wherein the non-oxidizing atmosphere is an atmosphere of vacuum or argon.
3. The method of manufacturing a silicon carbide semiconductor element according to claim 1, wherein a nickel silicide film is formed in a portion of the nickel film during the heat treating.

4. The method of manufacturing a silicon carbide semiconductor element according to claim 3 further comprising, after the heat treating,
   removing the nickel oxide film with a hydrochloric acid solution; and
   forming an aluminum film on a surface of the nickel silicide film from which the nickel oxide film has been removed.

5. The method of manufacturing a silicon carbide semiconductor element according to claim 3 further comprising
   removing the nickel oxide film with a hydrochloric acid solution
   forming a nickel aluminum film on a surface of the nickel silicide film after removing the nickel oxide film,
   forming an aluminum film on the surface of the nickel aluminum film.

6. The method of manufacturing a silicon carbide semiconductor element according to claim 1, wherein the nickel film that is formed has a thickness in a range of 0.05 µm to 0.2 µm, and the nickel oxide film that is formed has a thickness in a range of 0.05 µm to 0.15 µm.

7. The method of manufacturing a silicon carbide semiconductor element according to claim 5, wherein the nickel aluminum film that is formed has a thickness in a range of 5 nm to 20 nm, and the aluminum film that is formed has a thickness in a range of 2 µm to 4 µm.

8. The method of manufacturing a silicon carbide semiconductor element according to claim 5, wherein the nickel aluminum film is formed by means of a sputtering method using a nickel aluminum target containing nickel in a range of 40 at % to 60 at %, with the remainder being aluminum.

* * * * *